(12) United States Patent
Sung et al.

(10) Patent No.: US 10,873,005 B2
(45) Date of Patent: Dec. 22, 2020

(54) SEMICONDUCTOR ELEMENT AND SEMICONDUCTOR ELEMENT PACKAGE COMPRISING SAME

(71) Applicant: LG INNOTEK CO., LTD., Seoul (KR)

(72) Inventors: Youn Joon Sung, Seoul (KR); Yong Gyeong Lee, Seoul (KR); Min Sung Kim, Seoul (KR); Su Ik Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/463,766

(22) PCT Filed: Nov. 24, 2017

(86) PCT No.: PCT/KR2017/013531
§ 371 (c)(1),
(2) Date: May 23, 2019

(87) PCT Pub. No.: WO2018/097649
PCT Pub. Date: May 31, 2018

(65) Prior Publication Data
US 2019/0280158 A1    Sep. 12, 2019

(30) Foreign Application Priority Data
Nov. 24, 2016    (KR) .......................... 10-2016-0157702

(51) Int. Cl.
*H01L 33/14*    (2010.01)
*H01L 33/32*    (2010.01)
(Continued)

(52) U.S. Cl.
CPC ............ *H01L 33/145* (2013.01); *H01L 33/14* (2013.01); *H01L 33/32* (2013.01); *H01L 33/36* (2013.01); *H01L 33/48* (2013.01)

(58) Field of Classification Search
CPC ........ H01L 33/145; H01L 33/14; H01L 33/36; H01L 33/32; H01L 33/48
See application file for complete search history.

(56) References Cited

U.S. PATENT DOCUMENTS

| 2010/0289036 A1 | 11/2010 | Kim et al. |
| 2013/0026448 A1* | 1/2013 | Chu ...................... H01L 33/405 257/13 |

(Continued)

FOREIGN PATENT DOCUMENTS

| JP | 2005-252086 | 9/2005 |
| KR | 10-0972852 | 7/2010 |

(Continued)

OTHER PUBLICATIONS

International Search Report (with English Translation) and Written Opinion dated Mar. 2, 2018 issued in Application No. PCT/KR2017/013531.

*Primary Examiner* — Victor A Mandala
(74) *Attorney, Agent, or Firm* — KED & Associates LLP (57) ABSTRACT

An embodiment discloses a semiconductor element comprising: a first conductive semiconductor layer; a second conductive semiconductor layer; an active layer arranged between the first conductive semiconductor layer and the second conductive semiconductor layer; and an electron blocking layer arranged between the second conducive semiconductor layer and the active layer, wherein the section of the first conductive semiconductor layer decreases in a first direction, the electron blocking layer has an area in which the section thereof increases in the first direction, and the first direction is defined from the first conductive semiconductor layer to the second conductive semiconductor layer.

17 Claims, 8 Drawing Sheets

(51) Int. Cl.
H01L 33/48 (2010.01)
H01L 33/36 (2010.01)

(56) References Cited

U.S. PATENT DOCUMENTS

| | | | |
|---|---|---|---|
| 2014/0353580 A1 | 12/2014 | Kang et al. | |
| 2016/0240737 A1* | 8/2016 | Ide | H01L 33/32 |
| 2017/0062681 A1* | 3/2017 | Miyoshi | H01L 33/60 |
| 2017/0179341 A1* | 6/2017 | Chao | H01L 33/0095 |
| 2018/0062040 A1* | 3/2018 | Simin | H01L 33/08 |
| 2018/0323346 A1* | 11/2018 | Lee | G02F 1/133603 |
| 2018/0358510 A1* | 12/2018 | Kopp | H01L 33/32 |

FOREIGN PATENT DOCUMENTS

| | | | |
|---|---|---|---|
| KR | 10-2013-0139099 | | 12/2013 |
| KR | 10-2016-0123607 | | 10/2016 |
| WO | WO 2009/143229 | * | 11/2009 |

* cited by examiner

SEMICONDUCTOR ELEMENT AND SEMICONDUCTOR ELEMENT PACKAGE COMPRISING SAME

CROSS-REFERENCE TO RELATED PATENT APPLICATIONS

This application is a U.S. National Stage Application under 35 U.S.C. § 371 of PCT Application No. PCT/KR2017/013531, filed Nov. 24, 2017, which claims priority to Korean Patent Application No. 10-2016-0157702, filed Nov. 24, 2016, whose entire disclosures are hereby incorporated by reference.

TECHNICAL FIELD

The present invention relates to a semiconductor element and a semiconductor element package including the same.

BACKGROUND ART

Since semiconductor devices including compounds, such as GaN and AlGaN, have many advantages in that energy band gaps are wide and easy to adjust, the semiconductor devices can be variously used for light-emitting devices, light-receiving devices, various diodes, and the like.

Particularly, the light-emitting devices such as light-emitting diodes and laser diodes using III-V or II-VI compound semiconductor materials can express various colors such as red, green, and blue, emit ultraviolet light as thin film growth technologies and device materials are developed, emit high efficiency white light when phosphors are used or colors are mixed, and have advantages in low power consumption, semi-permanent lifespan, quick response time, safety, and eco-friendliness when compared to the conventional light sources such as fluorescent tubes and incandescent lamps.

In addition, when light-receiving devices, such as a photodetector and a solar cell, are manufactured using III-V or II-VI compound semiconductor materials, since the light-receiving devices absorb light in various wavelength ranges to generate a current due to developed device materials, light in various wavelength ranges from a gamma ray range to a radio frequency range can be used. In addition, the light-receiving devices can be easily used for power control, microwave circuits, or communication modules due to their advantages in quick response time, safety, eco-friendliness, and easy adjustment of device materials thereof.

Therefore, applications of the semiconductor devices are widened to transmission modules of optical communications, light-emitting diode (LED) backlights substituting for cold cathode fluorescence lamps (CCFL) forming backlights of liquid crystal display (LCD) devices, white LED lighting devices substituting for fluorescent tubes or incandescent lamps, vehicle head lights, traffic lights, and sensors configured to detect gas or fire. In addition, applications of the semiconductor devices can be widened to high frequency application circuits, other power control apparatuses, and communication modules.

Particularly, the light-emitting device emitting light in an ultraviolet wavelength band can perform a curing or sterilizing action and can be used for curing, medical, and sterilizing purposes.

Recently, research on ultraviolet light-emitting devices is being actively carried out, but there is a problem in that the light extraction efficiency of the ultraviolet light-emitting device decreases relatively.

DISCLOSURE

Technical Problem

The present invention is directed to providing a semiconductor element with improved light extraction efficiency.

Objectives to be solved by embodiments are not limited to the above-described objectives and will include objectives and effects which can be identified by solutions for the objectives and the embodiments described below.

Technical Solution

One aspect of the present invention provides a semiconductor element including: a first conductive semiconductor layer; a second conductive semiconductor layer; an active layer disposed between the first conductive semiconductor layer and the second conductive semiconductor layer; and an electron blocking layer disposed between the second conductive semiconductor layer and the active layer, wherein the first conductive semiconductor layer has a cross-sectional area which decreases in a first direction, the electron blocking layer has a cross-sectional area which increases in the first direction, and the first direction is a direction from the first conductive semiconductor layer toward the second conductive semiconductor layer.

The semiconductor element may include a first electrode disposed in a region the first conductive semiconductor layer is exposed and a second electrode disposed on the second conductive semiconductor layer.

The semiconductor element may include a substrate disposed under the first conductive semiconductor layer.

The electron blocking layer may include AlGaN.

An aluminum composition of the electron blocking layer may be increased when the electron blocking layer is closer to the active layer.

An angle between a side surface of the electron blocking layer and a horizontal axis may range from 55° to 80°, and the horizontal axis may be perpendicular to the first direction.

The second conductive semiconductor layer may include a region in which a cross-sectional area increases in the first direction.

Advantageous Effects

According to the embodiment, light extraction efficiency is improved.

Various useful advantages and effects of the present invention are not limited to the above-described advantages and may be understood in a process in which specific embodiments are described.

MODES OF THE INVENTION

The embodiments of the present invention may be modified into different forms or the plurality of embodiments may be combined, and the scope of the present invention is not limited to the embodiments which will be described below.

Although a description given in a specific embodiment is not given in other embodiments, the description may be understood to be descriptions of the other embodiments as long as there are no opposite or inconsistent descriptions given.

For example, when a feature of an element A is described in a specific embodiment and a feature of an element B is described in another embodiment, the scope of the present invention includes an embodiment in which the elements A and B are combined even when the embodiment is not clearly described as long as there are no opposite or inconsistent descriptions given.

In a description of the embodiment, in a case in which any one element is described as being formed on (or under) another element, such a description includes both a case in which the two elements are formed to be in direct contact with each other and a case in which the two elements are in indirect contact with each other such that one or more other elements are interposed between the two elements. In addition, in a case in which one element is described as being formed on (or under) an element, such a description may include a case in which one element is formed at an upper side or a lower side with respect to the element.

Hereinafter, the embodiments of the present invention will be described in detail with reference to the accompanying drawings so that those skilled in the art may easily perform the present invention.

Figure 1:
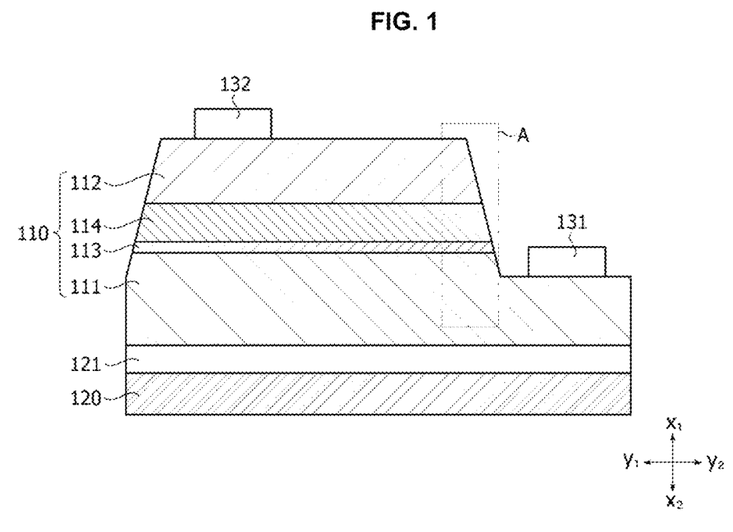
FIG. 1 is a conceptual view illustrating a semiconductor element according to one embodiment of the present invention.

FIG. 1 is a conceptual view illustrating a semiconductor element according to one embodiment of the present invention.

Referring to FIG. 1, the semiconductor element according to the embodiment may include a substrate 120, a buffer layer 121, a first conductive semiconductor layer 111, an active layer 113, an electron blocking layer 114, and a second conductive semiconductor layer 112.

The substrate 120 may include a conductive substrate or insulating substrate. The substrate 120 may be formed of a material suitable for growing a semiconductor material or a carrier wafer. The substrate 120 may be formed of a material selected from among sapphire (Al2O3), SiC, GaAs, GaN, ZnO, Si, GaP, InP, and Ge but is not limited thereto. As necessary, the substrate may be removed.

The buffer layer 121 may be disposed between the first conductive semiconductor layer 111 and the substrate 120. The buffer layer 121 may relieve lattice mismatch between the light-emitting structure 110 and the substrate 120.

The buffer layer 121 may include any one among AlN, GaN, InN, InGaN, AlGaN, InAlGaN, and AlInN. The buffer layer 121 may be doped with a dopant but is not limited thereto.

The buffer layer 121 may be grown as a single crystal on the substrate 120, and the buffer layer 121 grown as the single crystal may improve crystallinity of the first conductive semiconductor layer 111.

The first conductive semiconductor layer 111 may be formed of a Ill-V or II-VI compound semiconductor or the like and may be doped with a first dopant. The first conductive semiconductor layer 111 may be selected from among semiconductor materials having a composition formula of $In_{x1}Al_{y1}Ga_{1-x1-y1}N$ ($0 \leq x1 \leq 1$, $0 \leq y1 \leq 1$, $0 \leq x1+y1 \leq 1$), for example, GaN, AlGaN, InGaN, and InAlGaN. In addition, the first dopant may be an N-type dopant such as Si, Ge, Sn, Se, and Te. In a case in which the first dopant is the N-type dopant, the first conductive semiconductor layer 111 doped with the first dopant may be an N-type semiconductor layer.

The active layer 113 is disposed between the first conductive semiconductor layer 111 and the second conductive semiconductor layer 112. The active layer 113 is a layer in which electrons (or holes) injected through the first conductive semiconductor layer 111 meet holes (or electrons) injected through the second conductive semiconductor layer 112. As the electrons and the holes are recombined and transitioned to a low energy level, the active layer 113 may generate light in an ultraviolet light wavelength.

The active layer 113 may have one structure among a single well structure, a multi well structure, a single quantum well structure, a multi quantum well (MQW) structure, a quantum dot structure, and a quantum line structure, but the structure of the active layer 113 is not limited thereto.

The second conductive semiconductor layer 112 may be formed on the active layer 113, may be formed of a Ill-V or II-VI compound semiconductor or the like and doped with a second dopant. The second conductive semiconductor layer 112 may be formed of a semiconductor material having a composition formula of $In_{x5}Al_{y2}Ga_{1-x5-y2}N$ ($0 \leq x5 \leq 1$, $0 < y2 \leq 1$, $0 \leq x5+y2 \leq 1$) or a material selected from among AlInN, AlGaAs, GaP, GaAs, GaAsP, and AlGaInP. In a case in which the second dopant is a P-type dopant such as Mg, Zn, Ca, Sr, and Ba, the second conductive semiconductor layer 112 doped with the second dopant may be a P-type semiconductor layer.

The electron blocking layer 114 may be disposed between the active layer 113 and the second conductive semiconductor layer 112. The electron blocking layer 114 may prevent a flow of electrons, which are supplied from the first conductive semiconductor layer 111 and discharged to the second conductive semiconductor layer 112, to increase a probability of recombination of the electrons and holes in the active layer 113. An energy band gap of the electron blocking layer 114 may be greater than those of the active layer 113 and/or the second conductive semiconductor layer 112.

The electron blocking layer 114 may be selected from among semiconductor materials, such as AlGaN, InGaN, and InAlGaN, having a composition formula of $In_{x1}Al_{y1}Ga_{1-x1-y1}N$ ($0 \leq x1 \leq 1$, $0 \leq y1 \leq 1$, $0 \leq x1+y1 \leq 1$), but is not limited thereto.

A first electrode 131 may be electrically connected to the first conductive semiconductor layer 111. A second electrode 132 may be disposed on and electrically connected to the second conductive semiconductor layer 112.

The first electrode 131 and the second electrode 132 may be ohmic electrodes. Each of the first electrode 131 and the second electrode 132 may be formed to include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), AI-Ga ZnO (AGZO), ZnO, IrOx, RuOx, NiO, RuOx/ITO, and Ni/IrOx/Au, or Ni/IrOx/Au/ITO, Ag, Ni, Cr, Ti, Al, Rh, Pd, Ir, Sn, In, Ru, Mg, Zn, Pt, Au, and Hf but is not limited thereto.

Figure 2:
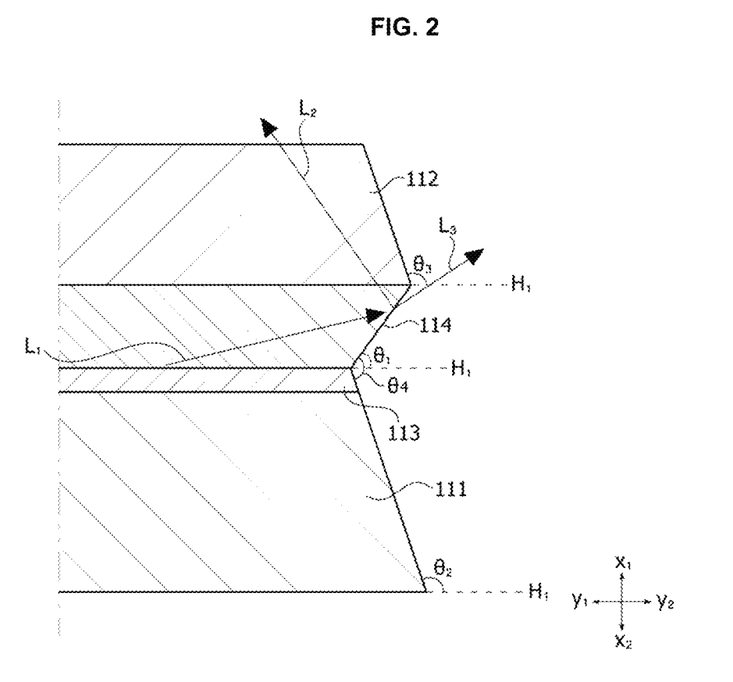
FIG. 2 is an enlarged view illustrating a region A of FIG. 1.
Figure 3:
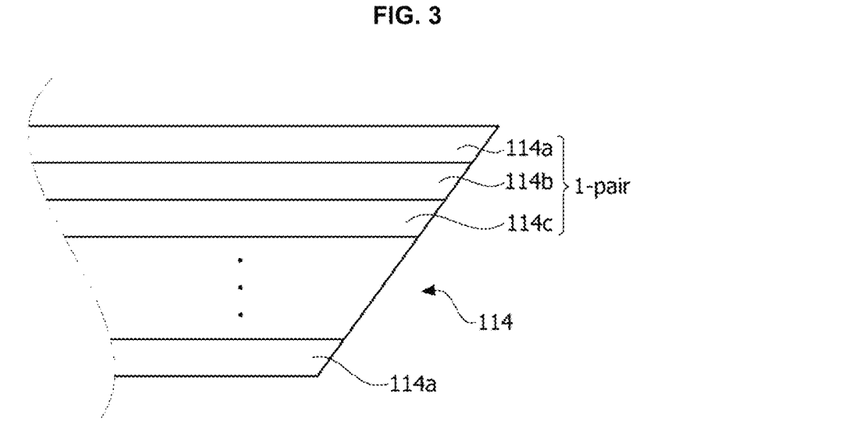
FIG. 3 is an enlarged view illustrating an electron blocking layer of FIG. 2.
Figure 4:
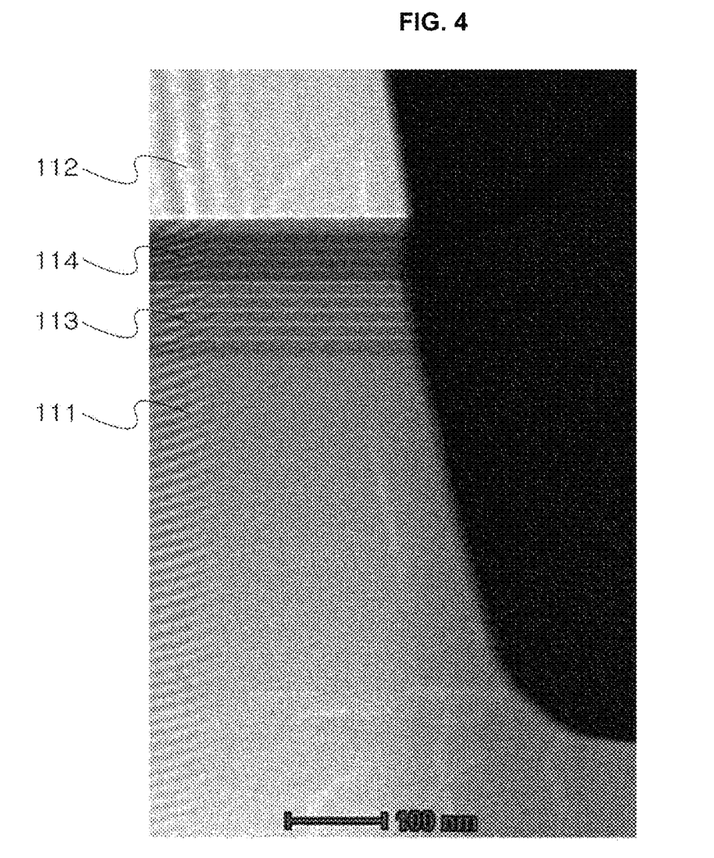
FIG. 4 is an image of a side surface of the semiconductor element of FIG.

FIG. 2 is an enlarged view illustrating a region A of FIG. 1, FIG. 3 is an enlarged view illustrating the electron blocking layer of FIG. 2, and FIG. 4 is an image of a side surface of the semiconductor element of FIG. 1.

Referring to FIG. 2, a side surface of the light-emitting structure 110 may have an inclination. The inclination may be formed through mesa-etching. The mesa-etching may be performed using various etching gases but is not necessarily limited thereto.

A side surface inclination 82 of the first conductive semiconductor layer 111 may be inclined in a (+) direction toward a first direction. Here, the (+) direction may be a direction in which a cross-sectional area decreases toward the first direction. The (+) direction may be a direction between an x1 axis and an y1 axis in the drawing. The first direction (x1 direction) may be a direction from the first conductive semiconductor layer 111 toward the second conductive semiconductor layer 112.

The side surface inclination $\theta2$ of the first conductive semiconductor layer 111 may range from 90° to 130° with respect to a horizontal axis H1. The horizontal axis H1 may be a direction perpendicular to a thickness direction of the semiconductor structure. The side surface inclination $\theta2$ of the first conductive semiconductor layer 111 may be changed according to an aluminum composition, a kind of an etching gas, an etching time period, and the like. The active layer 113 may be inclined at the same angle as the first conductive semiconductor layer 111 but is not necessarily limited thereto.

A side surface inclination $\theta3$ of the second conductive semiconductor layer 112 may be the same as the side surface inclination $\theta2$ of the first conductive semiconductor layer 111. However, the side surface inclination $\theta3$ is not necessarily limited thereto, and the side surface inclination $\theta3$ of the second conductive semiconductor layer 112 may be greater or less than the side surface inclination $\theta2$ of the first conductive semiconductor layer 111. A difference in inclination may be caused by a difference in aluminum composition but is not limited thereto.

As an aluminum composition increases in the light-emitting structure 110, a current diffusion property may be degraded in the light-emitting structure 110. In addition, a quantity of light emitted through a side surface of the active layer 113 increases when compared to a blue light-emitting device based on GaN (transverse magnetic (TM) mode). Such a TM mode may generally occur in an ultraviolet semiconductor element.

A side surface inclination $\theta1$ of the electron blocking layer 114 may be inclined in a (−) direction in the first direction unlike the side surface inclination $\theta2$ of the first conductive semiconductor layer 111 and the side surface inclination $\theta3$ of the second conductive semiconductor layer 112. The (−) direction may be a direction in which a cross-sectional area increases in the first direction (x1 direction). The (−) direction may be a direction between the x1 axis and an y2 axis in the drawing.

Some L2 of light L1 which is almost horizontally emitted from the active layer 113 may be reflected upward by a side surface of the electron blocking layer 114, and some L2 thereof may be refracted upward. Accordingly, the light extraction efficiency of the semiconductor element can be increased.

The side surface inclination $\theta1$ of the electron blocking layer 114 may range from 55° to 80° with respect to the horizontal axis H1. In a case in which the angle is less than 55° or greater than 80°, it may be difficult to refract (or reflect) most of the light emitted from the active layer 113 upward. In addition, it may be difficult to perform a subsequent passivation process. The horizontal axis H1 may have a direction perpendicular to the first direction (x1 direction).

The side surface angle of the active layer 113 may range from 90° to 130° which is the same as the inclination angle 62 of the first conductive semiconductor layer 111 as described above. Accordingly, a first angle $\theta4$ between the side surface of the electron blocking layer 114 and the side surface of the active layer 113 may range from 115° to 170°. Here, a ratio of the side surface inclination angle $\theta1$ of the electron blocking layer 114 to the first angle $\theta4$ may range from 1:1.43 to 1:3.1. In a case in which the ratio of the side surface inclination angle $\theta1$ of the electron blocking layer 114 to the first angle $\theta4$ is less than 1:1.43 or greater than 1:3.1, it may be difficult to refract the light, which is emitted from the active layer, upward.

The side surface inclination of the electron blocking layer 114 may be adjusted by adjusting various growth factors. For example, the inclination may be controlled by adjusting an aluminum composition of the electron blocking layer 114.

When a difference in aluminum composition increases sharply, film quality is lowered, and when the film quality is lowered, etching may be relatively and easily performed. Film quality of a lower portion of the electron blocking layer 114 may be lowered more than an upper portion of the electron blocking layer 114 because an aluminum composition of the lower portion of the electron blocking layer 114 increases sharply when compared to the active layer 113. Accordingly, the lower portion of the electron blocking layer 114 which is close to the active layer 113 may be more actively etched when compared to the upper portion thereof. As a result, the side surface may be inclined in the (−) direction. Conversely, side surfaces of the first conductive semiconductor layer 111, the active layer 113, and the second conductive semiconductor layer 112 may be inclined in the (+) direction. Alternatively, a growth speed of the lower portion of the electron blocking layer may be controlled to be advantageous for etching by being increased.

As still another method, the inclination of the electron blocking layer 114 may also be formed by adjusting a concentration of an etching gas. At least one of Cl2 and BCl3 may be used as the etching gas. Here, an inert gas (for example, Ar) may be further added to the etching gas.

When a ratio of Cl2 and BCl3 is controlled to range from 8:2 to 6:4, an amount of Cl may be relatively large. When the ratio of the Cl is adjusted within the above range, an inclination angle of the electron blocking layer 114 may be adjusted. Here, a total content of Cl may range from 60% to 80% of a total amount of all elements.

In a case in which the content of Cl is less than 60%, an etching efficiency decreases so that a difference in etching may decrease between the upper portion and the lower portion of the electron blocking layer 114. Accordingly, the inclination angle may become greater than 80°. In addition, in a case in which the content thereof becomes greater than 80%, the etching efficiency increases so that the difference in etching may become too large between the upper portion and the lower portion of the electron blocking layer 114. Accordingly, the inclination angle may become less than 55°. The side surface inclination θ1 of the electron blocking layer 114 may be controlled to range from 55° to 80° by changing the film quality and adjusting the etching gas.

In addition, the inclination of the electron blocking layer 114 may also be adjusted using a mask pattern. The inclination angle may be controlled by suppressing etching of the upper portion of the electron blocking layer using the mask pattern.

The inclination of the electron blocking layer 114 may be controlled to be in the (−) direction using the above-described various methods. However, the method of forming the side surface of the electron blocking layer to be inclined in the (−) direction is not limited thereto. That is, any of various methods of forming the side surface of the electron blocking layer to be inclined in the (−) direction may be selected.

Referring to FIG. 3, the electron blocking layer 114 may include first to third blocking layers 114a, 114b, and 114c. One pair includes the first to third blocking layers 114a, 114b, and 114c, and the electron blocking layer 114 may include about two to six pairs. A thickness of the electron blocking layer 114 may range from about 40 nm to 100 nm but is not limited thereto.

An aluminum composition of the first blocking layer 114a may be the same as that of the third blocking layer 114c. For example, the aluminum compositions of the first and third blocking layers 114a and 114c may range from 70% to 90%, and an aluminum composition of the second blocking layer 114b may range from 60% to 80%. The aluminum compositions of the first and third blocking layers 114a and 114c may be greater than that of the second blocking layer 114b.

Referring to FIG. 4, it can be seen that the inclination direction of the side surface of the electron blocking layer 114 is different from the inclination directions of the first conductive semiconductor layer 111 and the second conductive semiconductor layer 112. That is, the side surfaces of the first conductive semiconductor layer 111 and the second conductive semiconductor layer 112 are inclined such that widths thereof decrease upward, however, the side surface of the electron blocking layer 114 is inclined such that a width thereof increases upward.

Figure 5:
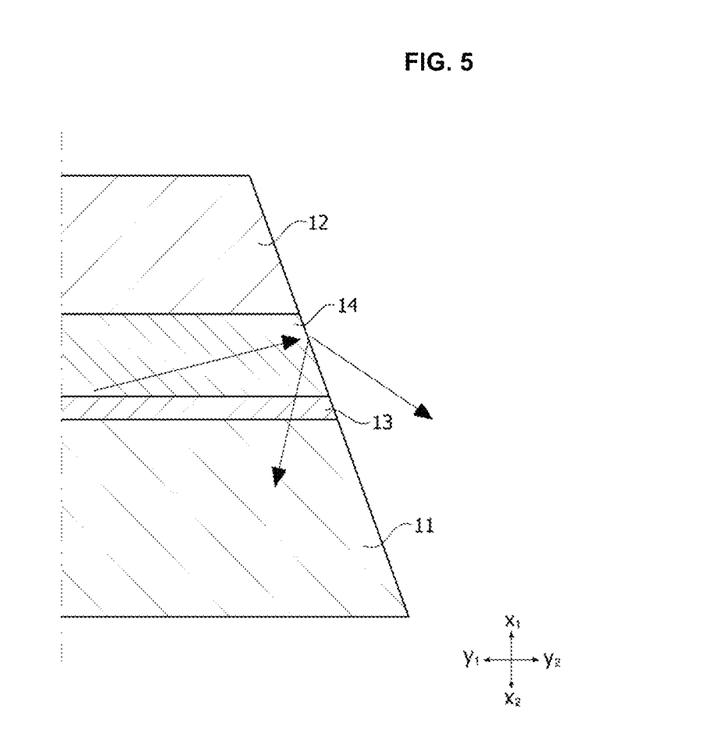
FIG. 5 is a view illustrating a side surface of a conventional semiconductor element.

FIG. 5 is a view illustrating a side surface of a conventional semiconductor element, and FIGS. 6A to 6D are views illustrating modified examples of FIG. 2.

Referring to FIG. 5, in the case of a conventional light-emitting structure, an inclination surface of an electron blocking layer 14 may be formed in the same direction as inclination surfaces of a first conductive semiconductor layer 11 and a second conductive semiconductor layer 12. In this case, it can be seen that light emitted from an active layer 13 is refracted or reflected downward. Accordingly, light extraction efficiency can be decreased.

Figure 6A:
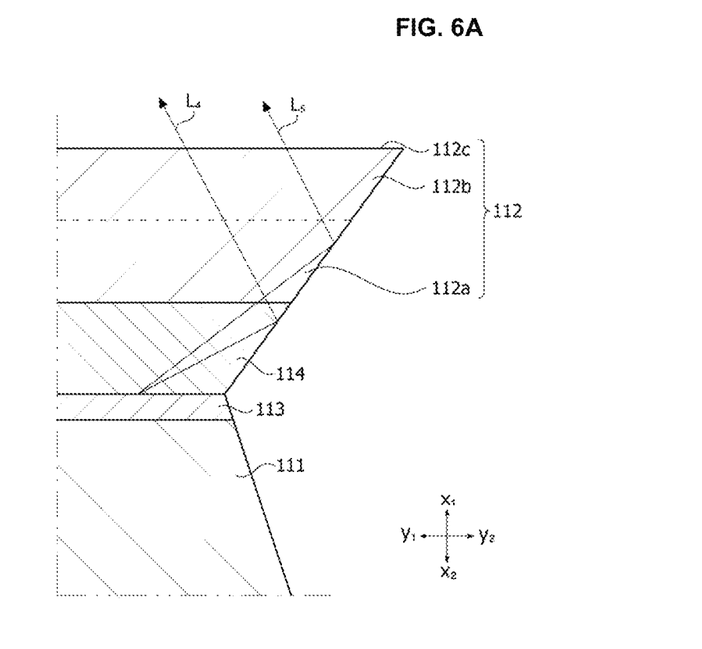
FIGS. 6A to 6D are views illustrating modified examples of FIG. 2.

Referring to FIG. 6A, an inclination surface of the second conductive semiconductor layer 112 may also be controlled in the (−) direction like the electron blocking layer 114. That is, the second conductive semiconductor layer 112 may be inclined such that an area increases in the first direction X1.

Here, only a lower region 112a of the second conductive semiconductor layer 112 may also be controlled in the (−) direction. For example, an aluminum composition of the lower region 112a of the second conductive semiconductor layer 112 may be controlled to be greater than that of an upper region 112b to adjust an angle thereof. However, the present invention is not limited thereto, and any of various methods of controlling the inclination of the semiconductor layer may be applied thereto.

For example, the aluminum composition of the lower region 112a may range from 40% to 60%, and the aluminum composition of the upper region 112b may range from 20% to 50%. An aluminum composition of a surface layer 112c may be controlled to range from 1 to 10% for ohmic connection.

According to the embodiment, since light L4, which is emitted to the side surface of the electron blocking layer 114, and light L5, which is emitted to a side surface of the second conductive semiconductor layer 112, of light emitted from the active layer 113 may be refracted and reflected upward, light extraction efficiency can be increased.

Figure 6B:
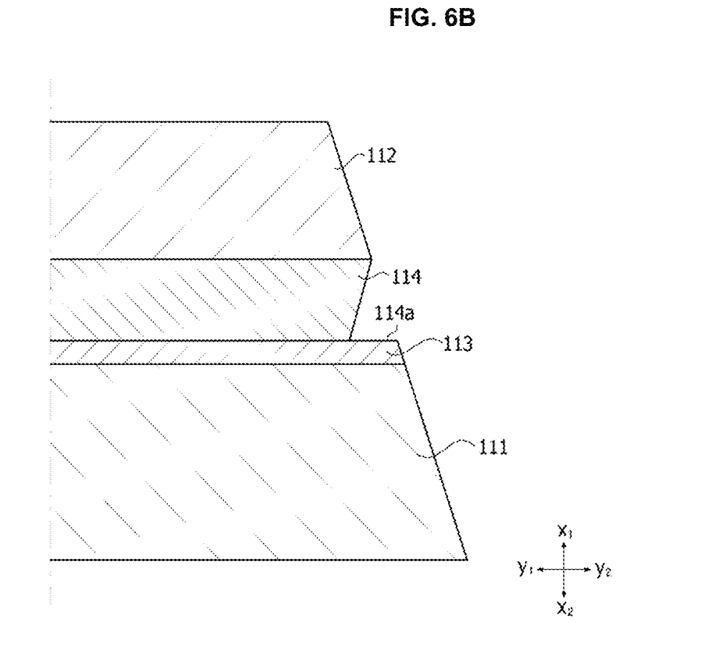

However, the present invention is not necessarily limited thereto, and the side surface of the electron blocking layer 114 may be variously changed. For example, as illustrated in FIG. 6B, the lower region of the electron blocking layer 114 may also be over etched so that a stepped portion 114a may be formed between the electron blocking layer 114 and the active layer 113. In this case, light extraction efficiency can be increased.

Figure 6C:
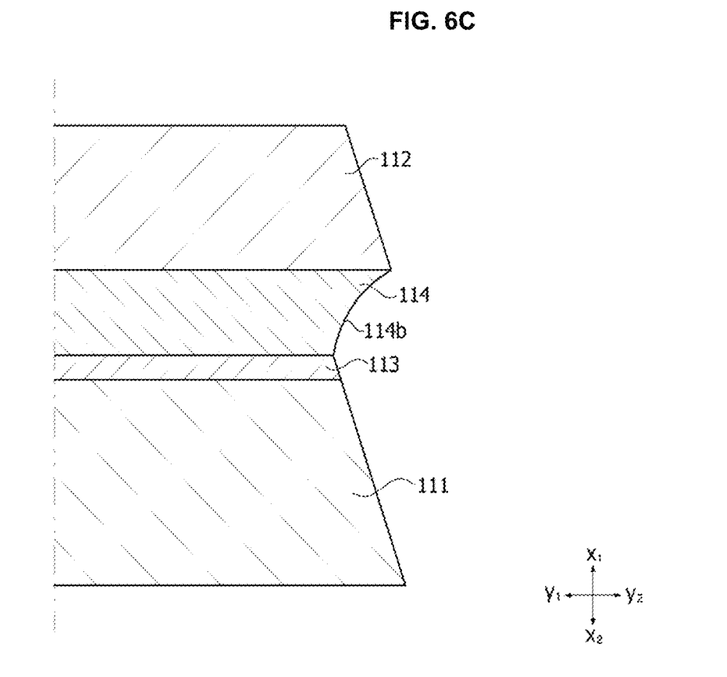
Figure 6D:
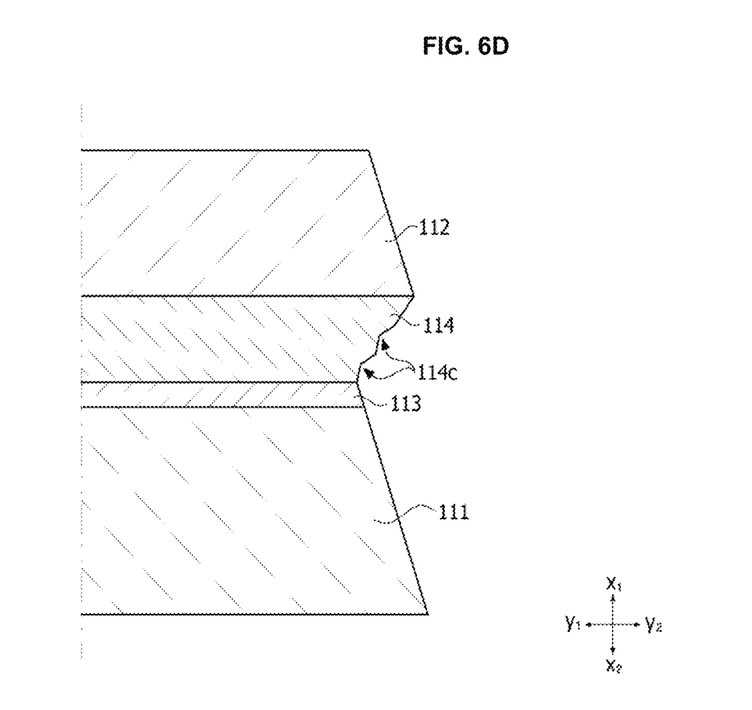

In addition, as illustrated in FIG. 6C, the side surface of the electron blocking layer 114 may also have a curvature 114b. In addition, as illustrated in FIG. 6D, the side surface of the electron blocking layer 114 may also include an irregular section 114c in which a gradient is changed. Such an irregular section may be formed on a superstructure in which an aluminum composition changes but is not necessarily limited thereto.

Figure 7:
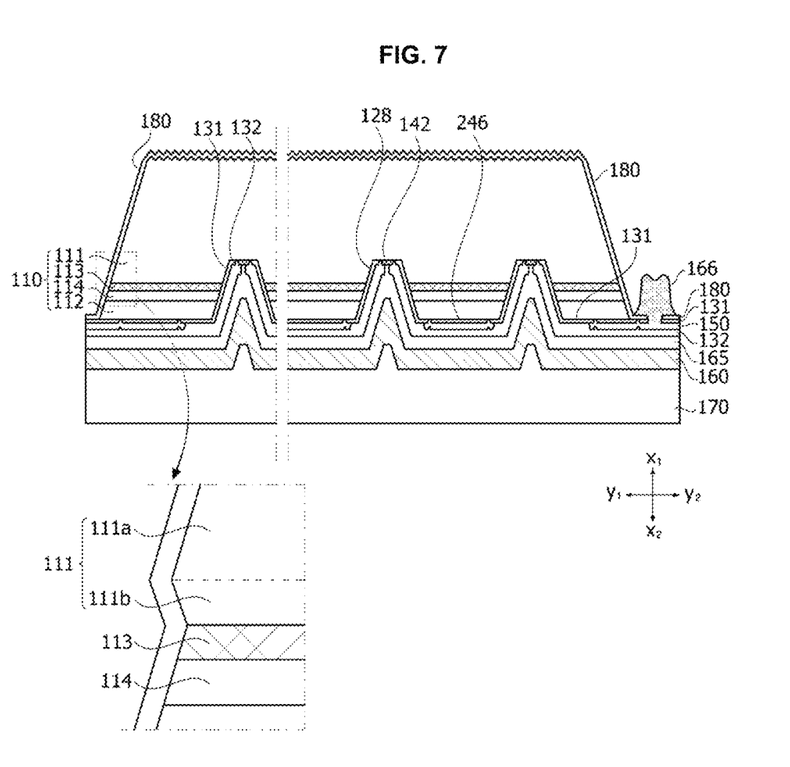
FIG. 7 is a conceptual view illustrating a semiconductor element according to another embodiment of the present invention.

FIG. 7 is a conceptual view illustrating a semiconductor element according to another embodiment of the present invention.

A light-emitting structure 120 may include a first conductive semiconductor layer 111, an active layer 113, an electron blocking layer 114, and a second conductive semiconductor layer 112. Recesses 128 may be disposed to pass through the active layer 113 from a lower surface of the second conductive semiconductor layer 112 to a partial region of the first conductive semiconductor layer 111.

According to the embodiment, the first conductive semiconductor layer 111 may be divided into an upper region 111a and a lower region 111b. Here, an inclination angle of the lower region 111b may be controlled in a (−) direction. As described above, the (−) direction may be a direction in which an area increases in a first direction (x1 direction).

Any of the above-described methods may be applied as a method of controlling the inclination angle. For example, an aluminum concentration or film quality of the first conductive semiconductor layer 111 may also be controlled to control the inclination angle, or a separate mask may also be used for controlling the inclination angle. In addition, any of the structures of FIGS. 6A, 6B, and 6C may be applied to the inclination of the side surface.

According to the embodiment, light emitted from the active layer 113 of a vertical ultraviolet semiconductor element toward the side surface may be refracted or reflected upward by the lower region 111b of the first conductive semiconductor layer 111. Accordingly, light extraction efficiency can be increased.

Since an aluminum composition of a surface layer of the second conductive semiconductor layer 112 in contact with second electrodes 246 ranges from 1% to 10%, ohmic connection may be easily achieved. In addition, since a thickness of the surface layer of the second conductive semiconductor layer 112 is greater than 1 nm and less than 30 nm, an amount of light absorption may be small.

A first conductive layer 165 may extend to an inside of the recess 128 to be electrically connected to the first conductive semiconductor layer 111. First electrodes 142 may be ohmic electrodes.

A second conductive layer 150 may be disposed under and electrically connected to the second conductive semiconductor layer 112. Since one region of the second conductive layer 150 is exposed, the second conductive layer 150 may be electrically connected to a second electrode pad 166.

The second electrode 246 may be disposed between the second conductive layer 150 and the second conductive semiconductor layer 112 and electrically connected thereto. Since the aluminum composition of the surface layer of the second conductive semiconductor layer 112 is relatively low, ohmic connection may be easily achieved.

Each of the first conductive layer 165 and the second conductive layer 150 may be formed of transparent conductive oxide (TCO). The TCO may be selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, and the like.

The first conductive layer 165 and the second conductive layer 150 may also include an opaque metal such as Ag, Ni, Al, Rh, Pd, Ir, Ru, Mg, Zn, Pt, Au, or Hf. In addition, the first conductive layer 165 may be formed of one or a plurality of layers in which TCO and the opaque metal are mixed but is not limited thereto.

The second electrode pad 166 may be disposed in one side corner region of the semiconductor element. Since a central portion of the second electrode pad 166 is recessed, an upper surface thereof may have a concave portion and a convex portion. A wire (not shown) may be bonded to the concave portion of the upper surface. Accordingly, since a bonding area increases, the second electrode pad 166 and the wire are more firmly bonded to each other.

Since the second electrode pad 166 may serve to reflect light, when the second electrode pad 166 is closer to the light-emitting structure 120, light extraction efficiency can be increased.

A height of the convex portion of the second electrode pad 166 may be higher than that of the active layer 113. Accordingly, the second electrode pad 166 may reflect light emitted from the active layer 113 in a horizontal direction of the element to increase light extraction efficiency and control an orientation angle.

A part of a first insulating layer 131 is open under the second electrode pad 166 so that the second conductive layer 150 may be electrically connected to the second electrode. A passivation layer 180 may be formed on an upper surface and a side surface of the light-emitting structure 120. The passivation layer 180 may be in contact with the first insulating layer 131 at a region adjacent to the second electrode or under the second electrode.

A width of a portion in which the first insulating layer 131 is open so that the second electrode pad 166 is in contact with the second conductive layer 150 may range, for example, from 40 µm to 90 µm. When the width is less than 40 µm, there is a problem of increasing an operating voltage, and when the width is greater than 90 µm, it may be difficult to secure a process margin for preventing the second conductive layer 150 from being exposed to the outside. When the second conductive layer 150 is exposed to an outer region of the second electrode, reliability of the element may be degraded. Accordingly, the width may range from 60% to 95% of an overall width of the second electrode pad 166.

The first insulating layer 131 may electrically insulate the first electrode 142 from the active layer 113 and the second conductive semiconductor layer 112. In addition, the first insulating layer 131 may electrically insulate the second conductive layer 150 from the first conductive layer 165.

The first insulating layer 131 may be formed of at least one selected from the group consisting of SiO2, SixOy, Si3N4, SixNy, SiOxNy, Al2O3, TiO2, AlN, and the like but is not limited thereto. The first insulating layer 131 may be formed as a single layer or a plurality of layers. For example, the first insulating layer 131 may be a distributed Bragg reflector (DBR) having a multilayer structure including Si oxide or a Ti compound. However, the first insulating layer 131 is not necessary limited thereto, and the first insulating layer 131 may include various reflective structures.

In a case in which the first insulating layer 131 performs an insulating function, the first insulating layer 131 may reflect light upward, which is emitted from the active layer toward a side surface thereof, to increase light extraction efficiency. In an ultraviolet semiconductor element, as the number of recesses 128 increases, light extraction efficiency may become more effective as described below.

The second conductive layer 150 may cover the second electrode. Accordingly, one electrical channel may be formed through the second electrode pad 166, the second conductive layer 150, and the second electrode.

The second conductive layer 150 may completely surround the second electrode and be in contact with the side surface and an upper surface of the first insulating layer 131. The second conductive layer 150 may be formed of a material which has a high adhesive force to the first insulating layer 131 and may be formed of at least one material selected from the group consisting of Cr, Al, Ti, Ni, Au, and an alloy thereof and may be formed as a single layer or a plurality of layers.

In a case in which the second conductive layer 150 is in contact with the side surface and the upper surface of the first insulating layer 131, thermal and electrical reliability of the second electrode may be improved. In addition, the second conductive layer 150 may have a reflective function of reflecting light upward which is emitted between the first insulating layer 131 and the second electrode.

The second conductive layer 150 may be disposed at a second separation distance which is a region in which the second conductive semiconductor layer is exposed between the first insulating layer 131 and the second electrode. The second conductive layer 150 may be in contact with a side surface and an upper surface of the second electrode and the side surface and the upper surface of the first insulating layer 131 at the second separation distance.

In addition, a region in which the second conductive layer 150 is in contact with the second conductive semiconductor layer so that a Schottky junction is formed may be disposed within the second separation distance, and since the Schottky junction is formed, a current may be easily dispersed.

A second insulating layer 132 may electrically insulate the second electrode 246 and the second conductive layer 150 from the first conductive layer 165. The first conductive layer 165 may pass through the second insulating layer 132 and may be electrically connected to the first electrode 142.

The first conductive layer 165 and a bonding layer 160 may be disposed along a lower surface of the light-emitting structure 120 and a shape of the recess 128. The first conductive layer 165 may be formed of a material with a high reflectivity. For example, the first conductive layer 165 may include aluminum. In a case in which the first conductive layer 165 includes aluminum, the first conductive layer 165 may serve to reflect light upward which is emitted from the active layer so as to increase light extraction efficiency.

The bonding layer 160 may include a conductive material. For example, the bonding layer 160 may include a material selected from the group consisting of gold, tin, indium, aluminum, silicon, silver, nickel, copper, and an alloy thereof.

A substrate 170 may be formed of a conductive material. For example, the substrate 170 may include a metal or a semiconductor material. The substrate 170 may be a metal with a high electrical and/or thermal conductivity. In this case, heat generated when the semiconductor element operates may be rapidly transferred to the outside.

The substrate 170 may include a material selected from the group consisting of silicon, molybdenum, silicon, tungsten, copper, aluminum, and an alloy thereof.

Irregularities may be formed on an upper surface of the light-emitting structure 120. The irregularities may increase the extraction efficiency of light emitted from the light-emitting structure 120. An average height of the irregularities may be changed according to an ultraviolet wavelength, and in a case of ultraviolet (UV)-C, the height may range from 300 nm to 800 nm, and when the average height ranges from 500 nm to 600 nm, light extraction efficiency may be increased.

Figure 8:
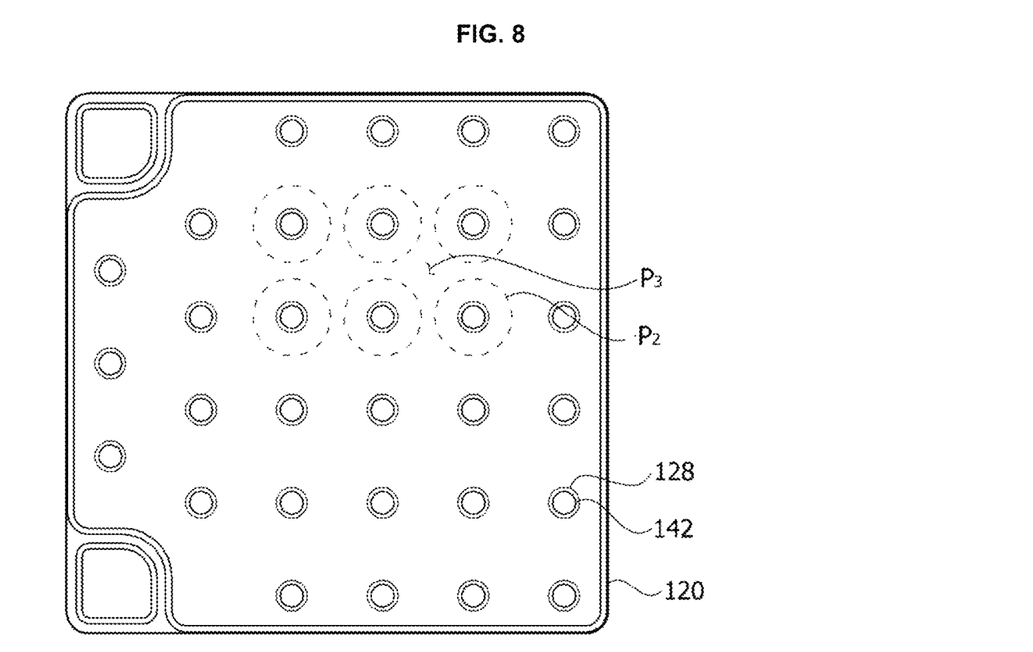
FIGS. 8 and 9 are views for describing a configuration in which light output increases according to a change in the number of recesses.
Figure 9:
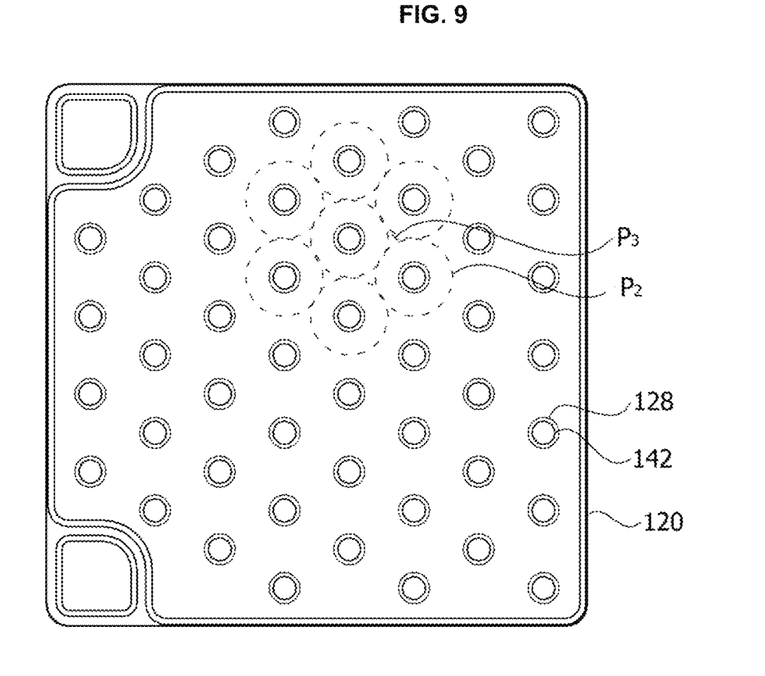

FIGS. 8 and 9 are views for describing a configuration in which light output increases according to a change in the number of recesses.

When an Al composition increases in the light-emitting structure 120, a current diffusion property may be degraded in the light-emitting structure 120. In addition, a quantity of light emitted through a side surface of the active layer increases when compared to a blue light-emitting device based on GaN (TM mode). Such a TM mode may generally occur in an ultraviolet semiconductor element.

According to the embodiment, a greater number of recesses 128 may be formed in a GaN semiconductor which emits light in a wavelength band of an ultraviolet region for diffusing a current when compared to the number of recesses 128 may be formed in a GaN semiconductor which emits blue light, and the first electrodes may be disposed thereon.

Referring to FIG. 8, when the Al composition increases, the current dispersion property may be degraded. Accordingly, a current is dispersed at only points adjacent to the first electrodes, and a current density may decrease sharply at points which are farther away therefrom. Accordingly, effective light-emitting regions P2 may decrease in area. The effective light-emitting region P2 may be defined as a region having border points at which a current density is 40% or less of a current density of the points adjacent to the first electrodes having a highest current density. For example, the effective light-emitting region P2 may be adjusted according to a current injection level and the Al composition thereof within a distance ranging from 5 μm to 40 μm from a center of the recess 128.

Particularly, a current density of a low current density region P3 between the first electrodes which are adjacent to each other is almost too low to contribute to emitting light. Accordingly, in the embodiment, additional first electrodes may be further disposed in the low current density region P3 in which the current density is low so as to increase light output.

Generally, since a GaN semiconductor layer has a relatively high current dispersion property, areas of the recesses 128 and the first electrodes may be minimized. This is because an area of the active layer decreases as the areas of the recesses 128 and the first electrodes increase. However, in the case of the embodiment, since the Al composition is high, a current diffusion property degrades relatively, and thus an area of the current density region P3 may be decreased by increasing the number of the first electrodes even though the area of the active layer is sacrificed.

Referring to FIG. 9, in a case in which the number of recesses 128 is 48, the recesses 128 may not be disposed in straight lines in width and height directions but may be disposed in a zigzag manner. In this case, since the area of the low current density region P3 decreases further, most of the active layer may participate in light emission. In a case in which the number of recesses 128 ranges from 70 to 110, a current disperses more effectively, an operating voltage decreases further, and thus light output can be increased. In a semiconductor element which emits UV-C, when the number of recesses 128 is less than 70, electrical and optical properties may be degraded, and when the number is greater than 110, the electric properties may be improved, but the optical properties may be degraded due to a decrease in volume of the light-emitting layer.

A first area in which the plurality of first electrodes are in contact with the first conductive semiconductor layer 111 may range from 7.4% to 20% or from 10% to 20% of a maximum horizontal cross-sectional area of the light-emitting structure 120. The first area may be the sum of areas in which the first electrodes are in contact with the first conductive semiconductor layer 111.

In a case in which the first area of the first electrodes is less than 7.4% thereof, since a current diffusion property may not be sufficient, light output decreases, and in a case in which the first area is greater than 20%, since the areas of the active layer and the second electrode decrease too much, there are problems in that an operating voltage increases and light output decreases.

In addition, a total area of the plurality of recesses 128 may range from 13% to 30% of the maximum horizontal cross-sectional area of the light-emitting structure 120. When the total area of the recesses 128 does not meet the condition, it is difficult to control the total of the first electrodes to range from 7.4% to 20%. In addition, there are problems in that an operating voltage increases and light output decreases.

A second area in which the second electrode is in contact with the second conductive semiconductor layer 112 may range from 35% to 70% of the maximum horizontal cross-sectional area of the light-emitting structure 120. The second area may be a total area in which the second electrode is in contact with the second conductive semiconductor layer 112.

In a case in which the second area is less than 35% thereof, since an area of the second electrode decreases too much, there are problems in that an operation voltage increases, and a hole injection efficiency decreases. In a case in which the second area is greater than 70% thereof, since the first area may not increase effectively, there is a problem in that electron injection efficiency decreases.

The first area and the second area are inversely proportion to each other. That is, in a case in which the number of recesses is increased to increase the number of the first electrodes, the area of the second electrode decreases. Electron and hole dispersion properties should be balanced to increase light output. Accordingly, it is important to define a suitable ratio of the first area and the second area.

A ratio (first area:second area) of the first area in which the plurality of first electrodes are in contact with the first conductive semiconductor layer to the second area in which the second electrode is in contact with the second conductive semiconductor layer may range from 1:3 to 1:10.

In a case in which the area ratio is greater than 1:10, since the first area is relatively small, a current dispersion property may be degraded. In addition, in a case in which the area ratio is less than 1:3, there is a problem in that the second area becomes relatively small.

Figure 10:
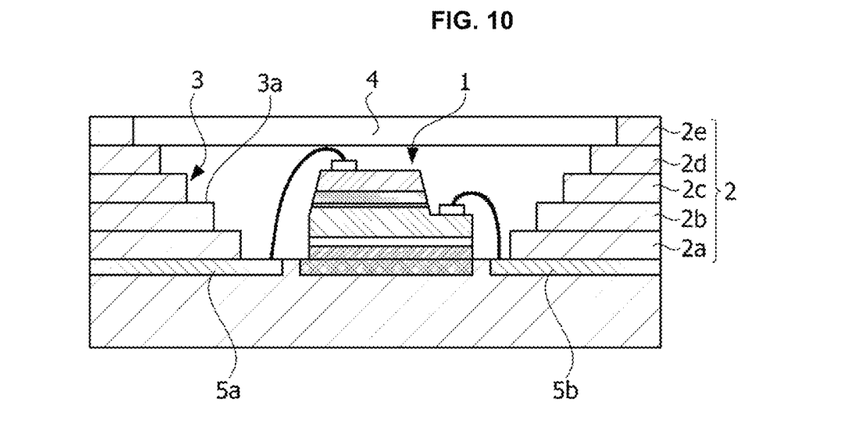
FIG. 10 is a conceptual view illustrating a semiconductor element package according to one embodiment of the present invention.

FIG. 10 is a conceptual view illustrating a semiconductor element package according to one embodiment of the present invention.

The semiconductor element may be formed as a package and used to cure a resin or resist and spin on dielectric (SOD) or spin on glass (SOG). Alternatively, the semiconductor element may also be used for therapy and medical purposes or to sterilize an air cleaner, a water purifier, and the like.

Referring to FIG. 10, the semiconductor element package may include a body 2 in which a groove 3 is formed, a semiconductor element 1 disposed in the body 2, and a pair of lead frames 5a and 5b disposed in the body 2 and electrically connected to the semiconductor element 1. The semiconductor element 1 may include all of the above-described components.

The body 2 may include a material or a coated layer which reflects ultraviolet light. The body 2 may be formed by stacking a plurality of layers 2a, 2b, 2c, and 2d. The plurality of layers 2a, 2b, 2c, and 2d may be formed of one material or different materials.

The groove 3 is formed to be widened in a direction farther away from the semiconductor element, and a step 3a may be formed on an inclination surface.

A light transmission layer 4 may cover the groove 3. The light transmission layer 4 may be formed of a glass material but is not limited thereto. When a material is capable of effectively transmitting ultraviolet light, the material of the light transmission layer 4 is not particularly limited. An inside of the groove 3 may be an empty space.

The semiconductor element may be used as a light source of a lighting system, a light source of an image display apparatus, or a light source of a lighting device. That is, the semiconductor element may be disposed in a case and applied to various electronic devices which provide light. For example, in a case in which the semiconductor element and red, green, and blue (RGB) phosphors are mixed and used, white light with a high color rendering index (CRI) may be realized.

The above-described semiconductor element is formed as a light-emitting device package and may be used as a light source of a lighting system. For example, the semiconductor element may be used as a light source of an image display apparatus, a light source of a lighting device, and the like.

The semiconductor element may be used as an edge type backlight unit or a direct type backlight unit when used as a backlight unit of the image display apparatus, and the semiconductor element may be used in a lighting apparatus or as a bulb type lighting device when used as the light source of the lighting device. In addition, the semiconductor element may also be used as a light source of a mobile phone.

The light-emitting device includes a laser diode in addition to the above-described light-emitting diode.

The laser diode may include the first conductive semiconductor layer, the active layer, and the second conductive semiconductor layer of the above-described structure like the light-emitting device. In addition, the laser diode uses an electro-luminescence phenomenon in which light is emitted when a P-type first conductive semiconductor and an N-type second conductive semiconductor are bonded to each other and a current is applied thereto, but there are differences in orientation and phase of emitted light. That is, the laser diode may emit light in one specific wavelength (monochromatic beam) and one phase in one direction by using a stimulated emission phenomenon, a constructive interference, and the like and may be used for optical communication, medical equipment, semiconductor process equipment, and the like due to such features.

A photodetector, which is a kind of transducer configured to detect light and convert an intensity thereof to an electrical signal, may be an example of a light-receiving element. Such a photodetector includes a photocell (silicon or selenium), a light output pre-element (cadmium sulfide or cadmium selenide), a photodiode (for example, a photodiode having a peak wavelength in a visible blind spectral region or a true blind spectral region), a phototransistor, a photo-multiplier tube, a photo-tube (vacuum or gas-filled), an infra-red (IR) detector, and the like but is not limited thereto.

In addition, the semiconductor element such as the photodetector may generally be manufactured using a direct bandgap semiconductor with a high photoconversion efficiency. Alternatively, the photodetector has various structures, and the most typical photodetector includes a p-type/insulator/n-type (PIN)-type photodetector using a p-n junction, a Schottky-type photodetector using a Schottky junction, a metal/semiconductor/metal (MSM)-type photodetector, and the like.

The photodiode may include the first conductive semiconductor layer, the active layer, and the second conductive semiconductor layer of the above-described structure like the light-emitting device and is formed to have a p-n junction or a PIN structure. The photodiode is operated by applying a reverse bias or a zero bias, and when light is incident on the photodiode, electrons and holes are generated so that a current flows. In this case, an amount of current is almost proportional to an intensity of the light incident on the photodiode.

The photocell or a solar cell is one kind of the photodiode and may include the first conductive semiconductor layer, the active layer, and the second conductive semiconductor layer of the above-described structure like the light-emitting device.

In addition, the semiconductor element may also be used as a rectifier of an electronic circuit through rectification characteristics of a general diode using a p-n junction and may be applied to an oscillation circuit by being applied to an ultrahigh frequency circuit.

In addition, the above-described semiconductor element is not necessarily formed of only a semiconductor and may further include a metal material in some cases. For example, the semiconductor element such as the light-receiving element may be formed of at least one among Ag, Al, Au, In, Ga, N, Zn, Se, P, and As and may also be formed of a semiconductor material doped with a P-type or N-type dopant or an intrinsic semiconductor material.

The embodiments have been particularly described but are only examples and do not limit the present invention. It will be understood by those skilled in the art that various changes and applications that are not illustrated above will be made within a range without departing from the essential characteristics of the present invention. For example, the components specifically described in the embodiments may be changed. In addition, it should be interpreted that differences related to the changes and applications fall within the scope of the present invention defined by the appended claims.

The invention claimed is:

1. A semiconductor element comprising:
a first conductive semiconductor layer;
a second conductive semiconductor layer;
an active layer disposed between the first conductive semiconductor layer and the second conductive semiconductor layer; and
a blocking layer disposed between the second conductive semiconductor layer and the active layer,
wherein the first conductive semiconductor layer has a cross-sectional area which decreases in a first direction,
the blocking layer has a cross-sectional area which increases in the first direction,
the first direction is a direction from the first conductive semiconductor layer toward the second conductive semiconductor layer,
wherein an aluminum composition of a region, which is close to the active layer, of the blocking layer is higher than an aluminum composition of a region, which is close to the second conductive semiconductor layer, of the blocking layer, and
wherein the active layer is to generate ultraviolet light.

2. The semiconductor element of claim 1, wherein the active layer and the blocking layer include AlGaN.

3. The semiconductor element of claim 1, wherein the blocking layer includes a stepped portion formed by etching a side surface of the blocking layer so that the active layer is exposed.

4. The semiconductor element of claim 1, wherein a side surface of the blocking layer includes a curved line.

5. The semiconductor element of claim 1, wherein a side surface of the blocking layer includes a protrusion.

6. The semiconductor element of claim 1, wherein:
the blocking layer includes a first blocking layer, a second blocking layer, and a third blocking layer; and
aluminum compositions of the first blocking layer and the third blocking layer are higher than an aluminum composition of the second blocking layer.

7. The semiconductor element of claim 1, wherein:
an angle between a side surface of the blocking layer and a horizontal axis ranges from 55° to 80°; and
the horizontal axis is perpendicular to the first direction.

8. The semiconductor element of claim 1, wherein the second conductive semiconductor layer includes a region in which an area increases in the first direction.

9. The semiconductor element of claim 1, further comprising a plurality of recesses penetrate the second conductive semiconductor layer and the active layer and penetrate up to a portion of the first conductive semiconductor layer.

10. The semiconductor element of claim 9, further comprising:
a first electrode disposed in the plurality of recesses;
a second electrode disposed under the second conductive semiconductor layer;
a first conductive layer electrically connected to the first electrode; and
a second conductive layer electrically connected to the second electrode.

11. The semiconductor element of claim 10, further comprising:
a first insulating layer disposed in the plurality of recesses; and
a second insulating layer disposed between the first conductive layer and the second conductive layer.

12. The semiconductor element of claim 11, further comprising a conductive substrate disposed under the first conductive layer.

13. A semiconductor element package comprising:
a housing; and
a semiconductor element disposed in the housing,
wherein the semiconductor element includes a first conductive semiconductor layer,
a second conductive semiconductor layer,
an active layer disposed between the first conductive semiconductor layer and the second conductive semiconductor layer, and
a blocking layer disposed between the second conductive semiconductor layer and the active layer,
wherein the first conductive semiconductor layer has a cross-sectional area which decreases in a first direction,
the blocking layer has a cross-sectional area which increases in the first direction,
the first direction is a direction from the first conductive semiconductor layer toward the second conductive semiconductor layer,
wherein an aluminum composition of a region, which is close to the active layer, of the blocking layer is higher than an aluminum composition of a region, which is close to the second conductive semiconductor layer, of the blocking layer, and
wherein the active layer is to generate ultraviolet light.

14. The semiconductor element package of claim 13, wherein the active layer and the blocking layer include AlGaN.

15. The semiconductor element package of claim 13, wherein the blocking layer includes a stepped portion formed by etching a side surface of the blocking layer so that the active layer is exposed.

16. The semiconductor element package of claim 13, wherein:
the blocking layer includes a first blocking layer, a second blocking layer, and a third blocking layer; and
aluminum compositions of the first blocking layer and the third blocking layer are higher than an aluminum composition of the second blocking layer.

17. The semiconductor element package of claim 13, wherein:
an angle between a side surface of the blocking layer and a horizontal axis ranges from 55° to 80°; and
the horizontal axis is perpendicular to the first direction.

* * * * *